United States Patent
Le

(10) Patent No.: US 6,501,320 B1
(45) Date of Patent: Dec. 31, 2002

(54) SELF-POWERED, MAXIMUM-CONDUCTIVE, LOW TURN-ON VOLTAGE CMOS RECTIFIER

(75) Inventor: Hung Pham Le, San Jose, CA (US)

(73) Assignee: Exar Corporation, Fremont, CA (US)

( * ) Notice: Subject to any disclaimer, the term of this patent is extended or adjusted under 35 U.S.C. 154(b) by 0 days.

(21) Appl. No.: 09/625,237

(22) Filed: Jul. 25, 2000

(51) Int. Cl.$^7$ .............................. H03K 5/08; H03L 5/00
(52) U.S. Cl. ........................ 327/330; 327/55; 327/57
(58) Field of Search .......................... 327/330, 55, 57, 327/538, 540, 541, 543

(56) References Cited

U.S. PATENT DOCUMENTS

| | | | | |
|---|---|---|---|---|
| 5,210,503 A | * | 5/1993 | Sawamura | 330/110 |
| 5,510,972 A | * | 4/1996 | Wong | 363/127 |
| 5,523,940 A | * | 6/1996 | Wymelenberg | 363/127 |
| 5,689,209 A | * | 11/1997 | Williams et al. | 327/425 |
| 5,963,053 A | * | 10/1999 | Manohar et al. | 326/37 |
| 5,991,182 A | * | 11/1999 | Novac et al. | 363/126 |
| 6,060,943 A | * | 5/2000 | Jansen | 327/538 |
| 6,144,231 A | * | 11/2000 | Goldblatt | 327/57 |
| 6,212,084 B1 | * | 4/2001 | Turner | 363/127 |

* cited by examiner

Primary Examiner—Terry D. Cunningham
Assistant Examiner—Quan Tra
(74) Attorney, Agent, or Firm—Townsend and Townsend and Crew LLP

(57) ABSTRACT

A rectifier circuit with a transistor having first and second electrodes coupled between an input and output of the rectifier circuit. A latch has an output connected to a control node of the transistor, and has first and second inputs connected to the input and output of the rectifier circuit, respectively. The invention provides a self-contained, self-powered, self-regulated low turn-on voltage diode-rectifier with maximum current (on-state conductance) when forward-biased. This circuit can be inserted between any two nodes and behaves like a Schottky diode.

2 Claims, 5 Drawing Sheets

ON-STATE EQUIVALENT CIRCUIT

OFF-STATE EQUIVALENT CIRCUIT

SELF-POWERED, MAXIMUM-CONDUCTIVE, LOW TURN-ON VOLTAGE CMOS RECTIFIER

BACKGROUND OF THE INVENTION

The present invention relates to rectifier circuits, in particular those implemented in a CMOS design.

In CMOS circuit design, it is often desirable to have a diode rectifier available. One type of diode functions similarly to a discrete diode with its turn-on voltage and current conduction, but has the disadvantage of being tied to ground. One example is an $N^+$/P-well junction diode. The use of this diode is limited with its terminal tied to a common node, in this case the P-well or P-ground. Another type of diode is a $P^+$/N-well junction diode. This has a similar limitation with the N-well. Furthermore, a $P^+$/N-well diode is really a $P^+$/N/P bipolar device. Unfortunately, these diodes are basically parasitic diodes, and are thus not useful for many circuit design applications.

For a diode that is not connected to ground, the typical approach is to use an MOS transistor with the gate tied to the drain. There are two limitations to this type of a diode. The first limitation is that the turn-on voltage is higher than a diode, and is determined by Vt. This is the MOS threshold, typically 0.8–1.0 volts. In addition, the diode voltage/current relationship is governed by the equation $Ids=k(Vds-Vt)^2$. This equation reflects that the transistor connected as a diode not only does not turn on until a higher threshold is achieved, but has a more gradually ramped curve for achieving maximum current conduction.

Accordingly, it would be desirable to have a diode rectifier circuit with a low turn-on voltage and maximum current conductance when forward-biased, and that can be inserted between any two nodes.

SUMMARY OF THE INVENTION

The present invention provides a rectifier circuit with a transistor having first and second electrodes coupled between an input and output of the rectifier circuit. A latch has an output connected to a control node of the transistor, and has first and second inputs connected to the input and output of the rectifier circuit, respectively. The invention provides a self-contained, self-powered, self-regulated low turn-on voltage diode-rectifier with maximum current (on-state conductance) when forward-biased. This circuit can be inserted between any two nodes and behaves like a Schottky diode.

In one embodiment, the transistor is an MOS transistor and includes self-biased well logic to provide maximum voltage for the well potential. Preferably, the latch is a special comparator that is self-biased, self-regulated, and has minimal DC current consumption. In addition, it is high-speed, with low threshold switching.

In one embodiment, the latch is a comparator having a pair of first and second cross-coupled transistors each having a node, such as a source, connected to the input or output of the rectifier. A threshold reduction circuit is provided to reduce the threshold at the drain of the two cross-coupled transistors. Finally, a second pair of cross-coupled transistors connect between the threshold reduction circuits and ground. The control electrode of one of these second pair of cross-coupled transistors provides the output of the latch. The transistors of the comparator are biased on the verge of turning on, thus providing the low-threshold and high-speed switching. In addition, the configuration ensures that the current passed to ground on both sides of the latch is effectively shut down after switching, minimizing any DC current consumption to a negligible amount.

For a further understanding of the nature and advantages of the invention, reference should be made to the following description taken in conjunction with the accompanying drawings.

DESCRIPTION OF THE SPECIFIC EMBODIMENTS

Figure 1:
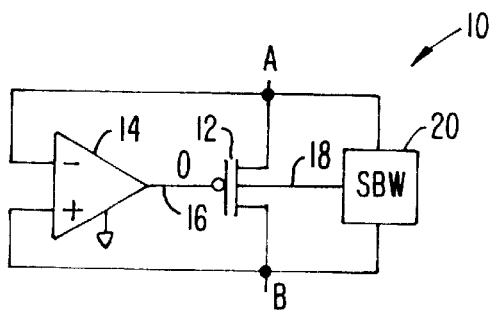
FIG. 1 is a block diagram of a diode-rectifier circuit according to the invention.

FIG. 1 shows a diode-rectifier circuit 10 according to an embodiment of the invention. Input and output nodes A and B are illustrated. These are connected to the source and drain of a PMOS transistor 12. A latch 14 has inputs connected to the A and B nodes, and an output 16 connected to the gate of transistor 12. The well 18 of transistor 12 is connected to a self-biasing well (SBW) logic circuit 20.

Figure 2:
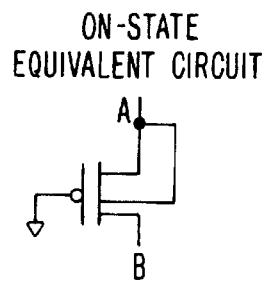
FIGS. 2 and 3 show equivalent circuits for the circuit of FIG. 1 for the on and off conditions.

The circuit of FIG. 1 operates when the voltage of node A exceeds that of node B by a small amount. This will cause the latch to latch the transistor 12 into an on state, allowing maximum current conduction. The equivalent circuit for this on state is shown in FIG. 2.

Figure 3:
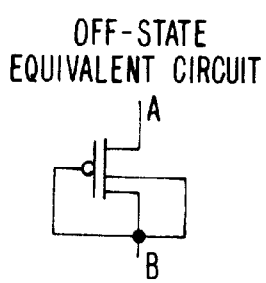

When the voltage of node B exceeds the voltage of node A, the latch turns off transistor 12, and no current is allowed to flow. The equivalent circuit for this off circuit is shown in FIG. 3.

Figure 4:
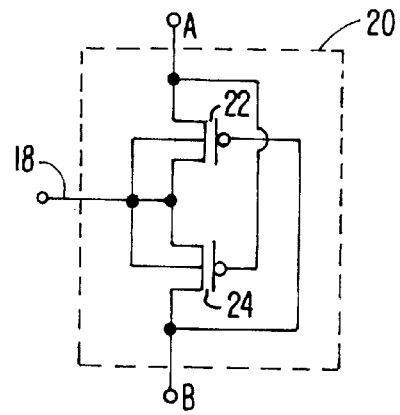
FIG. 4 is a circuit diagram of an embodiment of the self-biased well of FIG. 1.

FIG. 4 illustrates the self-biased well logic 20 of FIG. 1. A first PMOS transistor 22 has its source connected to node A and its drain connected to the source of a PMOS transistor 24. The drain of transistor 24 is connected to node B and to the gate of transistor 22. Node A, the source of transistor 22, is connected to the gate of transistor 24. The wells are connected together and to the connection between the two transistors. As can be seen, when node A is lower than node B by a sufficient amount, transistor 24 will turn on, tying the well to the B voltage level. Conversely, when node B is lower than node A by a sufficient amount, transistor 22 will turn on, tying the well to the A voltage. Thus, the well is always biased to the highest voltage between A and B.

Figure 5:
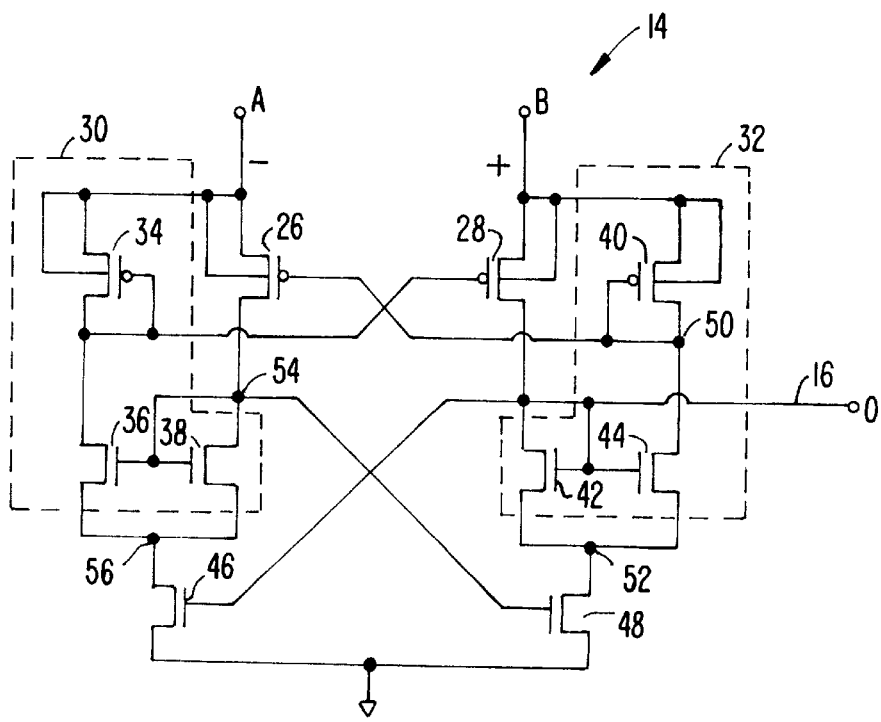
FIG. 5 is a circuit diagram of an embodiment of the latch of FIG. 1.

FIG. 5 is a circuit diagram of a preferred embodiment of comparator 14 of FIG. 1. The A and B nodes are connected to cross-coupled PMOS transistors 26 and 28. Threshold reduction circuits 30 and 32 lower the thresholds for turning on transistors 26 and 28 by dropping the voltages of gates of transistors 26 and 28 below the voltages of A and B. For circuit 30, this is done with a PMOS transistor 34 and a pair of NMOS transistors 36 and 38. Circuit 32 similarly contains a PMOS transistor 40 and NMOS transistors 42 and 44.

Finally, the comparator includes a pair of cross-coupled NMOS transistors 46 and 48. The gate of transistor 46 is connected to the output line 16 of the comparator.

In operation, if the voltage at A is greater than B, such as A being at 1 volt and B being at 0 volts, the circuit will operate as follows. Node B will be at 0 volts, and thus output 16 will be at 0 volts as will be the nodes 50 and 52. The 0 voltage at node 50 is applied to the gate of transistor 26, turning it on. This provides a voltage level of 1 at a node 54. This is applied to the gate of NMOS transistor 48, keeping it turned on and connecting 52 to ground, at 0 volts. Conversely, the 0 voltage on line 16 turns off transistor 46 when applied to its gate, ensuring that no current flows to ground. Thus, in this DC condition, virtually no current is allowed through transistor 46 (other than leakage current) and although transistor 48 is turned on, the voltage on both sides is 0, thus eliminating any current flow. This configuration, without any DC current, maintains node 16, the output, at a low level. This maintains transistor 12 of FIG. 1 in an on condition to conduct current from A to B. Since no current is drained off either node A to B by comparator 14, maximum current is provided through transistor 12.

If node B is subsequently raised above node A, to a value such as 2 volts, the circuit will operate as follows. Transistor 34 maintains the gate of transistor 28 at a value of 1Vt below the voltage at A. This would be approximately 0 volts, turning on transistor 28. Since in the first state, the voltage level at node B was 0, this did not matter. Now that B is raised 2 volts, this 2 volts is passed through to the output line 16, less the voltage drop across transistor 28. This will turn on transistor 46, pulling node 56 to ground, or 0 volts. The voltage at node 50 will be 1Vt below the 2 volts at node B through transistor 40, or approximately 1 volt. This will turn off transistor 26, allowing node 54 to fall to the level of node 56, or approximately 0 volts. This will, in turn, turn off transistor 48, preventing any further current flow through transistor 48. Thus, after some current flow through the transistors during switching, another steady state condition is established. This is the converse of the previous steady state, since now transistor 46 is on, but has 0 volts across it and thus no current flow. Conversely, transistor 48 is now off, also preventing any current flow.

The comparator of FIG. 5 thus provides an output which is at ground potential if the voltage of node A is greater than the voltage of node B, and is at approximately the B voltage potential if the voltage of node B is greater than the voltage of node A. This holds true regardless of the absolute values of the voltages in nodes A and B with respect to ground.

The comparator of FIG. 5 also eliminates the need for any supply voltage. It only has a connection to ground. The DC current is approximately 0 microamps, unlike other comparators using a differential amplifier approach. The circuit of FIG. 5 provides a simple yet fast 10 transistor CMOS circuit which is capable of switching at up to 200 MHz. No resistors or capacitors are needed.

Figure 6:
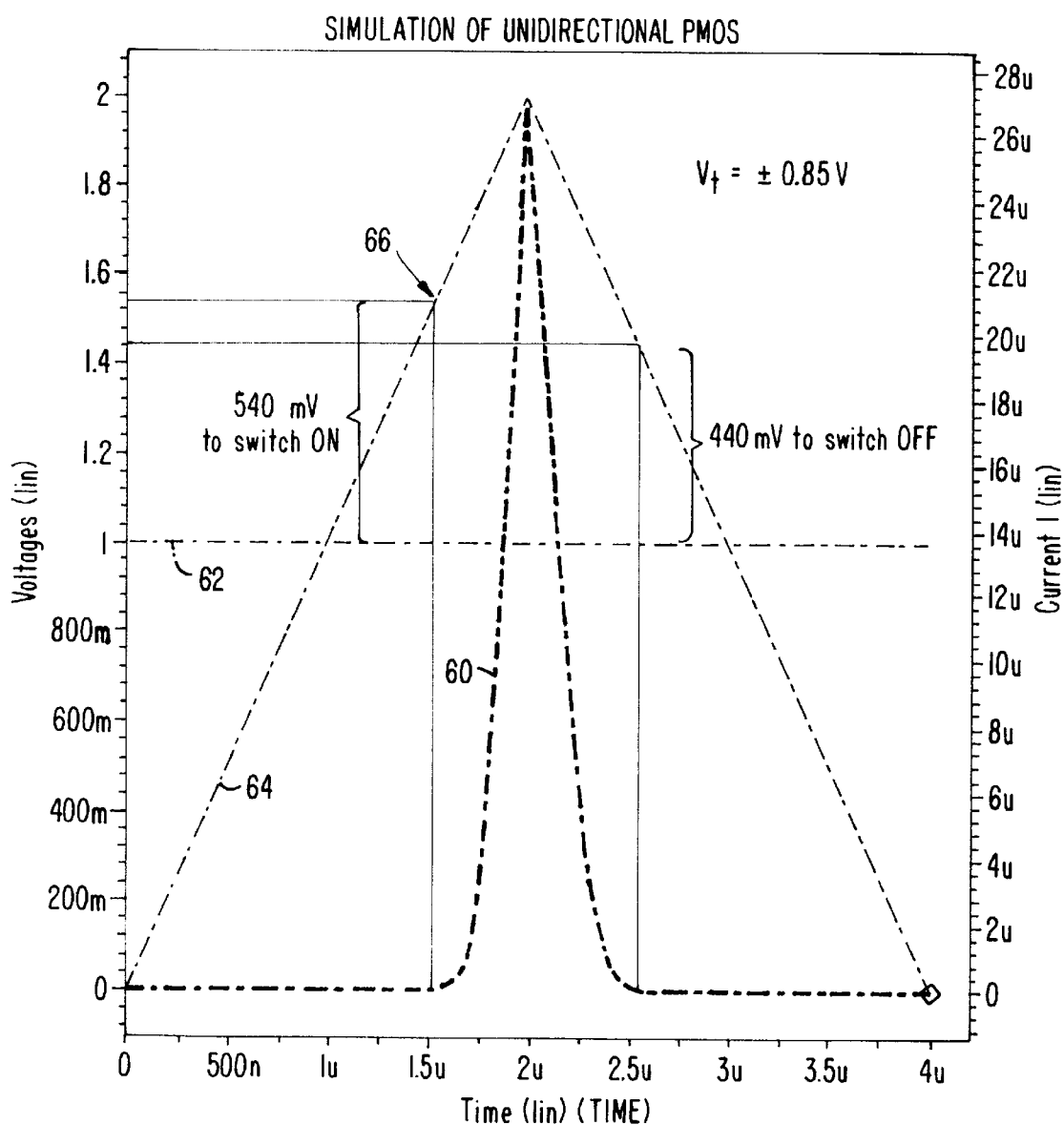
FIG. 6 is a graph illustrating the current through the circuit of FIG. 1 in response to a ramped voltage.

The comparator of FIG. 5 only requires a 500 mV difference between the voltages at nodes A and B to change the output state. Thus, a pseudo Schottky diode circuit is produced. FIG. 6 illustrates the operation of the circuit of FIG. 1 using the comparator of FIG. 5. The current from node A to node B is indicated by line 60. The voltage at node B is indicated by line 62, a constant 1 volt. The graph shows a ramp line 64 for the voltage at node A. As can be seen, at a time 66, the circuit switches on, with a rapid rise in current 60. This occurs at a point with an approximately 540 mV difference in voltage between node A and node B. On the down ramp signal, a 440 mV difference causes the diode-rectifier circuit to switch off.

Figure 7:
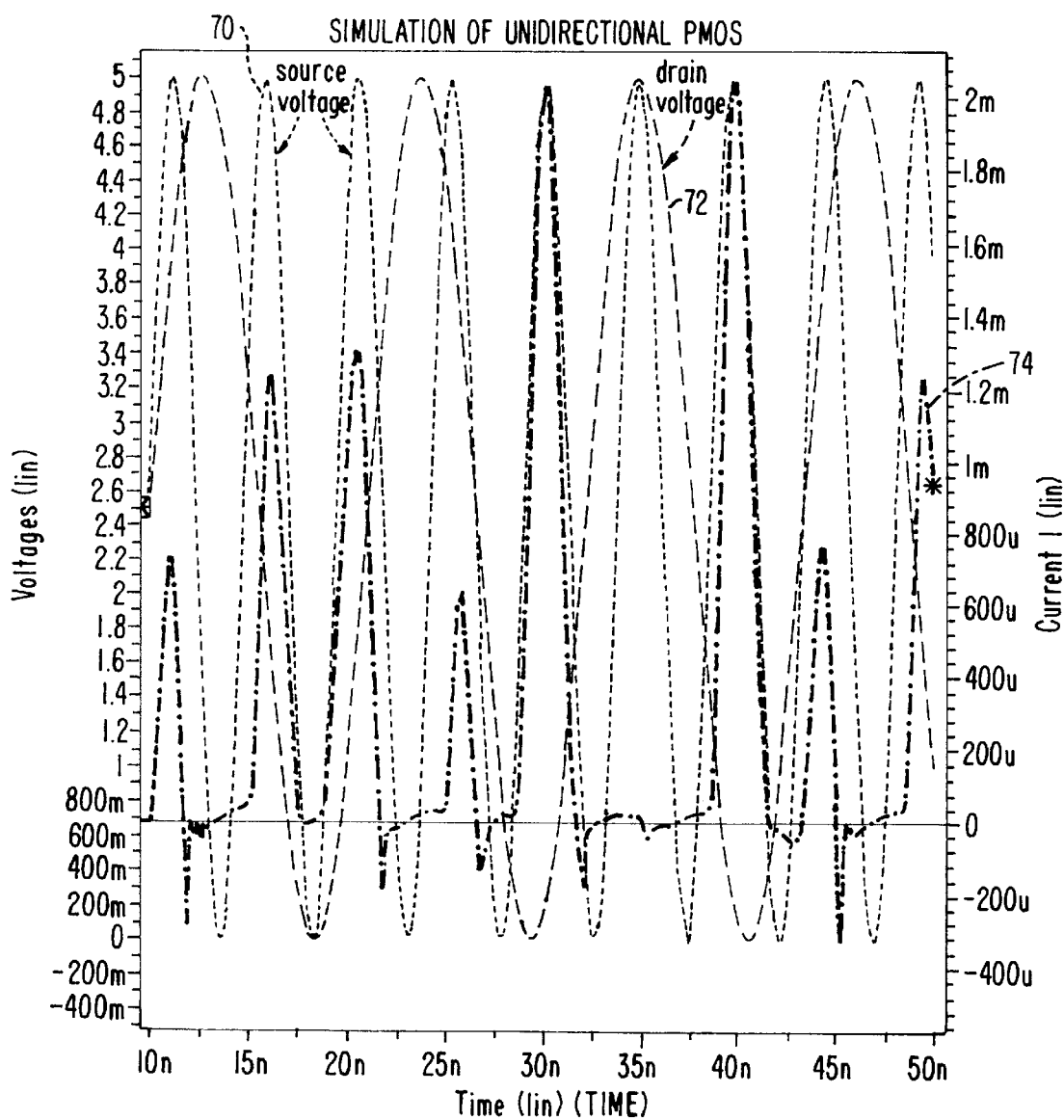
FIG. 7 is a graph illustrating the current response of the circuit of FIG. 1 in response to AC voltage variations.

FIG. 7 shows a rapidly switching analog signal, again illustrating the source voltage at node A on a line 70, the drain voltage at node B on a line 72 and the current between nodes A and B on a line 74.

Figure 8:
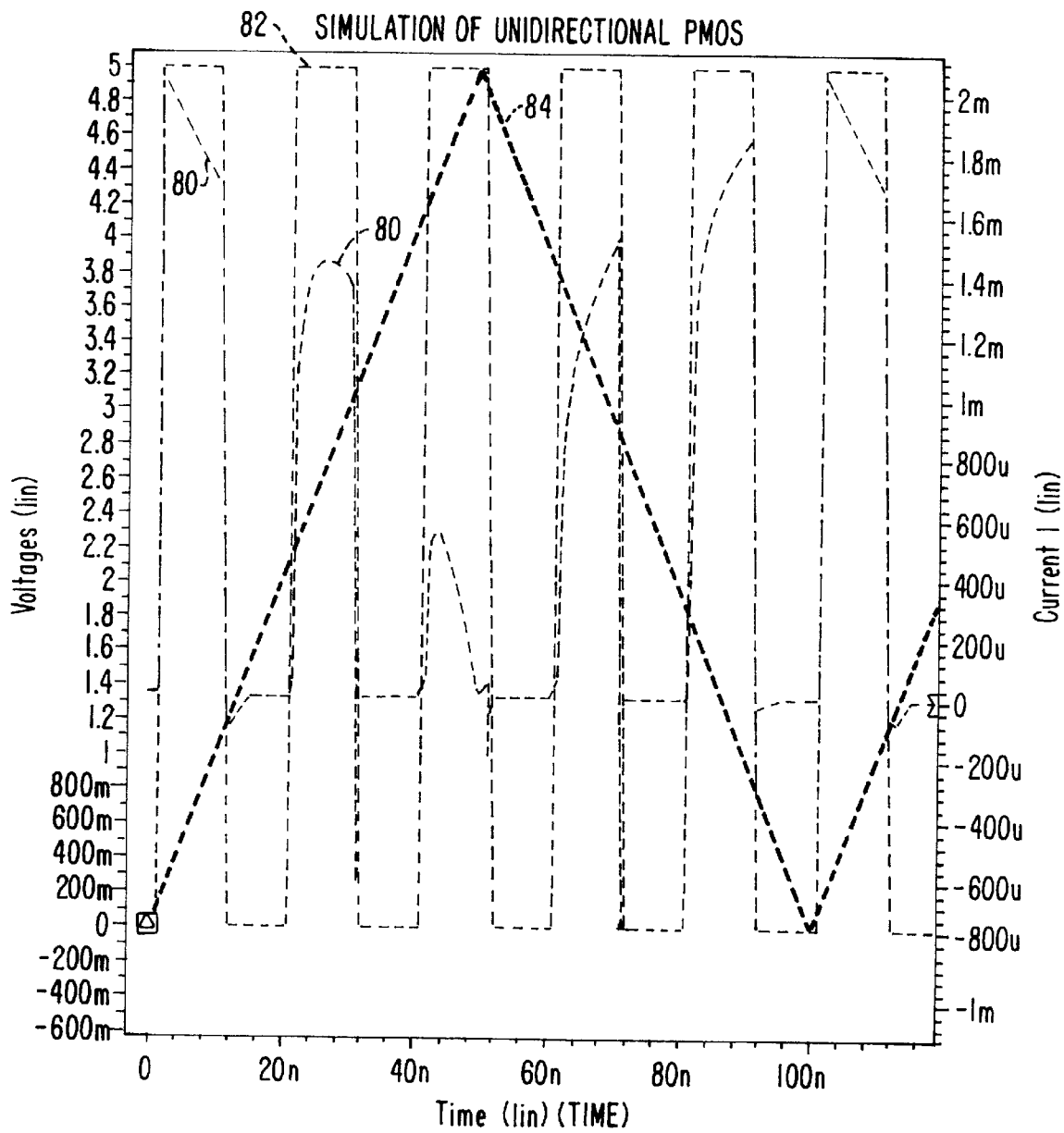
FIG. 8 is a graph illustrating the current response of the circuit of FIG. 1 in response to digital voltage variations.

FIG. 8 is yet another graph illustrating a digital signal of 50 MHz showing the resulting current as line 80 produced by the source voltage at node A (82) and the drain voltage at node B (84).

Figure 9:
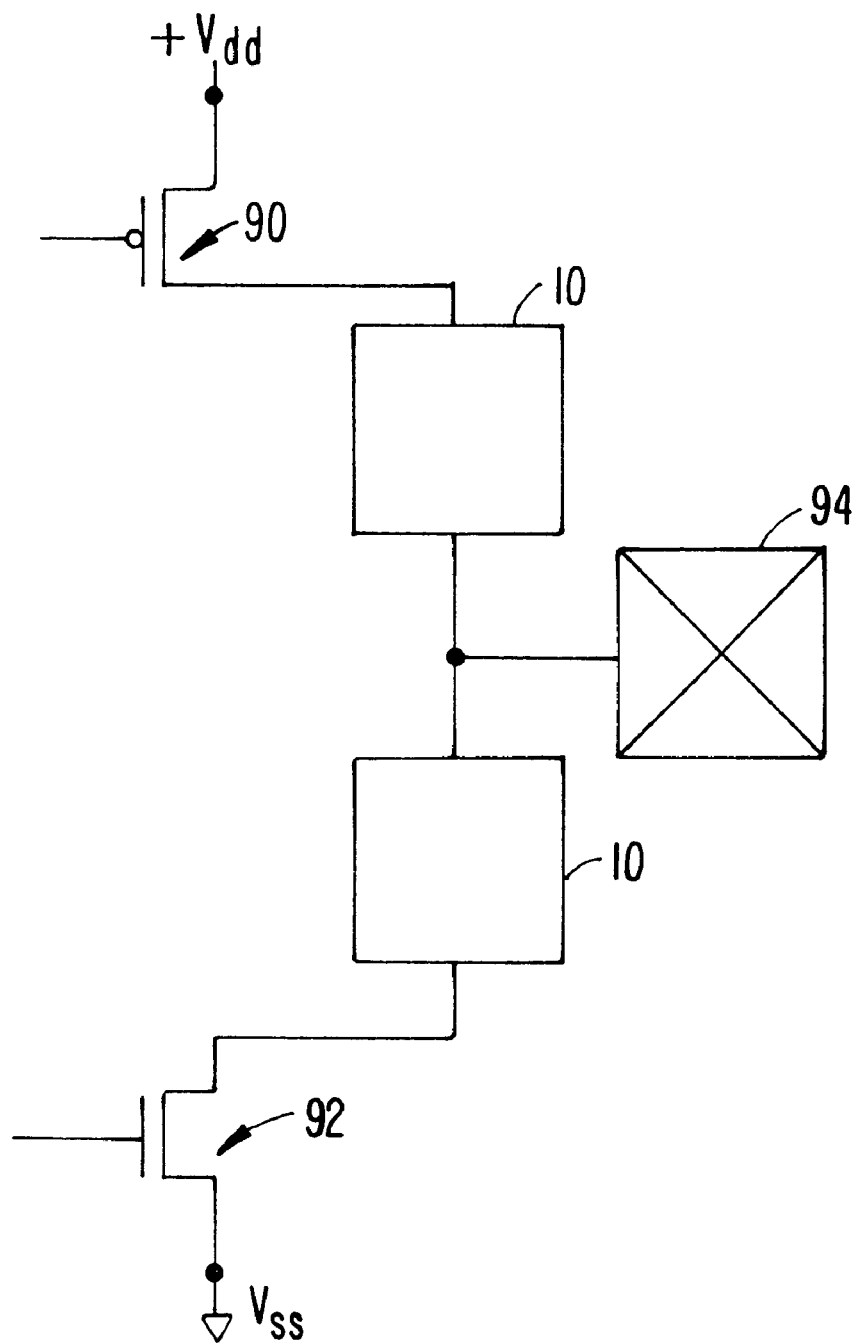
FIG. 9 is a diagram of a latch-up free I/O circuit according to an embodiment of the present invention.

The present invention has a number of potential applications. In one embodiment, it is used to provide a latch-up free I/O circuit design capability which can provide a rail-to-rail output signal. Such a configuration is shown in FIG. 9, where two circuits 10 according to the invention are provided in series with output driver transistors 90 and 92 and an I/O pad 94. This placement of the diodes allows a full rail-to-rail voltage swing. In contrast, a prior art approach would place Schottky diodes between the drain of transistor 90 and pad 94, and the drain of transistor 92 and pad 94. Thus, there would be an approximately 0.2 volt drop across the Schottky diode, enabling only a 4.8 volt signal where there is a 5 volt supply, thus not allowing rail-to-rail voltage levels.

In another application, the present invention could be used for overvoltage tolerant circuit realizations. Yet another embodiment could provide a Schottky-like rectifier with a 500 mV threshold.

As will be apparent to those of skill in the art, the present invention may be embodied in other specific forms without departing from the essential characteristics thereof. For example, transistor 12 in FIG. 1 could be an NMOS transistor instead of a PMOS transistor. A latch or comparator with a different transistor configuration than that shown in FIG. 5 could be used as long as it met the requirements of low switching threshold and minimal DC current. Accordingly, the foregoing description is intended to be illustrative, but not limiting, of the scope of the invention which is set forth in the following claims.

What is claimed is:

1. A rectifier circuit comprising:
   a transistor having first and second electrodes coupled between an input and an output of said rectifier circuit; and
   a latch having an output connected to a control node of said transistor, and having first and second inputs connected to said first and second electrodes of said transistor, wherein said latch comprises:
   first and second PMOS transistors having sources coupled to said input and output, respectively, of said rectifier circuit;
   third and fourth diode-connected PMOS transistors connected between the source and drain of said first and second PMOS transistors, respectively, the drain of said third PMOS transistor being connected to the gate of said second PMOS transistor and the drain of said fourth PMOS transistor being connected to the gate of said first PMOS transistor;
   first and second NMOS transistors having their gates and drains connected together, a source of said first NMOS transistor being connected to the drain of said third PMOS transistor and a source of said second NMOS transistor being connected to the drain of said first PMOS transistor;

third and fourth NMOS transistors having their gates and drains connected together, a source of said third NMOS transistor being connected to the drain of said fourth PMOS transistor and a source of said fourth NMOS transistor being connected to the drain of said second PMOS transistor;

a fifth NMOS transistor connecting the drains of said first and second NMOS transistors to ground; and a sixth NMOS transistor connecting the drains of said third and fourth NMOS transistors to ground.

2. A rectifier circuit comprising:

a transistor having first and second electrodes coupled between an input and an output of said rectifier circuit; and a latch having an output connected to a control node of said transistor, and having first and second inputs connected to said first and second electrodes of said transistor, wherein said latch comprises:

a first pair of first and second cross-coupled transistors, each having a node connected to one of an input and an output of said rectifier circuit;

a pair of first and second threshold reduction circuits, each connected to a second node of one of said first and second cross-coupled transistors, configured to reduce a threshold below one of said input and said output; and a second pair of cross-coupled transistors connected to said first and second threshold reduction circuits, a control node of one of said second pair of cross-coupled transistors being an output of said latch.

* * * * *